United States Patent [19]

Smith et al.

[11] Patent Number: 5,121,087

[45] Date of Patent: Jun. 9, 1992

[54] ELECTRONIC RESONATOR EMPLOYING AN FED RESONATOR ELEMENT

[75] Inventors: Robert T. Smith, Mesa, Ariz.; Robert C. Kane, Woodstock, Ill.

[73] Assignee: Motorola, Inc., Schaumburg, Ill.

[21] Appl. No.: 712,825

[22] Filed: Jun. 10, 1991

[51] Int. Cl.$^5$ .................. H03B 5/30; H01J 1/02; H01J 1/46; H01J 21/08
[52] U.S. Cl. .................. 331/154; 331/116 M; 331/177 R; 331/184; 313/146; 313/293
[58] Field of Search ........ 331/116 R, 115 FE, 116 M, 331/154, 177 R, 184; 313/146, 147, 152, 293

[56] References Cited

U.S. PATENT DOCUMENTS 3,544,750 12/1970 Adler .......................... 3131/146 X
4,818,914 4/1989 Brodie ........................ 315/169.1 X Primary Examiner—David Mis
Attorney, Agent, or Firm—Eugene A. Parsons

[57] ABSTRACT

An FED, modified with an electrostatically deformable anode, has a control network attached to electrodes thereof to switch the FED off as the anode is deformed by electrostatic force and switch the FED on as the anode returns to a quiescent state. Frequency selectivity is realized by incorporating a variable frequency determining network within the control network.

16 Claims, 4 Drawing Sheets

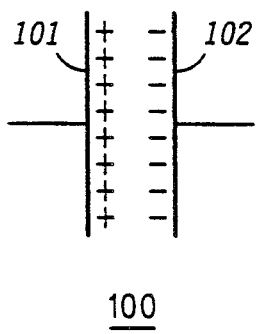
FIG. 1
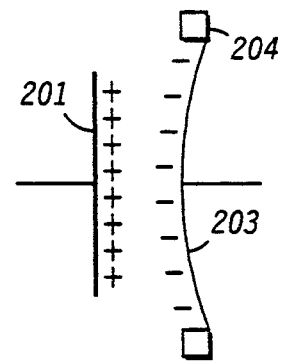
FIG. 2
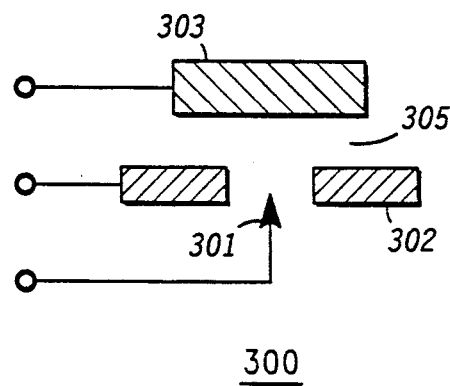
FIG. 3
FIG. 4A
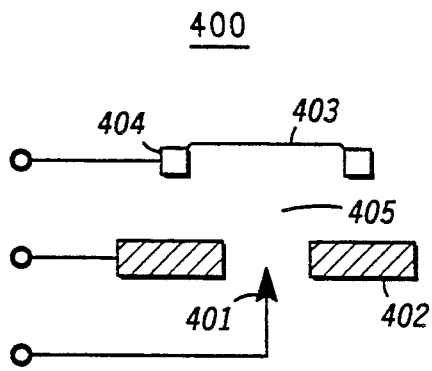
FIG. 4B
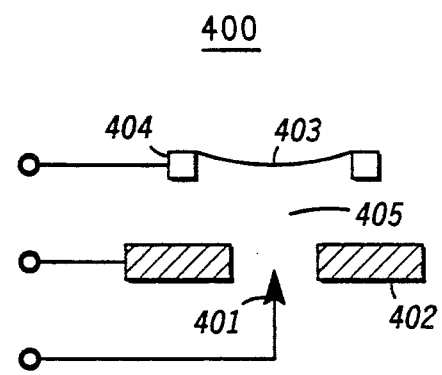

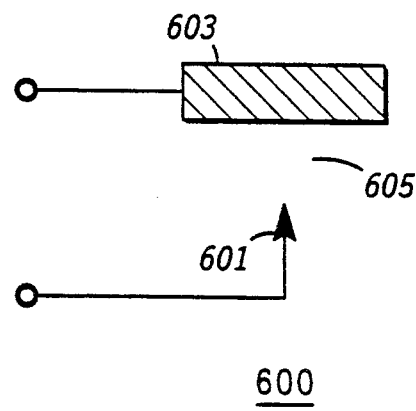
FIG. 6
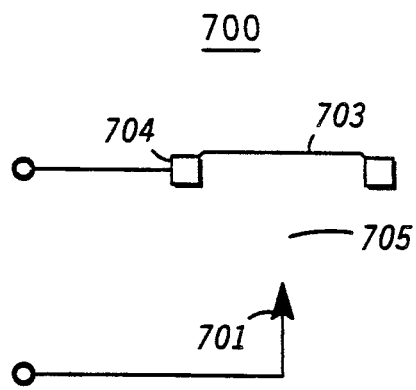
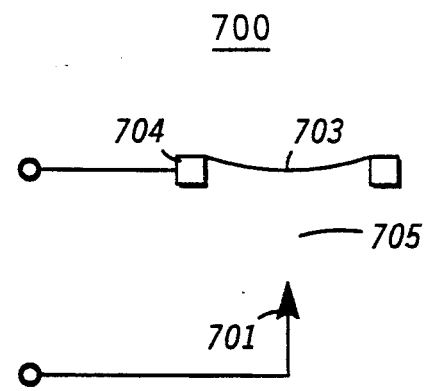

ELECTRONIC RESONATOR EMPLOYING AN FED RESONATOR ELEMENT

TECHNICAL FIELD

This invention relates generally to microelectronic field-emission devices (FEDs) and more particularly to a microelectronic FED employed as a resonator device.

BACKGROUND OF THE INVENTION

Electronic resonator(oscillator) circuits are known in the art and broadly employed in applications requiring periodic frequency sources. Electronic resonator circuits commonly employ resonator elements which exhibit physical displacement as the means of inducing operation at a desired frequency. Some limits on the maximum operating frequency are inherent to this type of resonator element due to the practical minimum size constraints. An alternative method of realizing an electronic resonator is to employ active switching devices in concert with passive network elements. Practical frequency limits for this second type of electronic resonator method include switching speed limitations of the switching devices, which are commonly semiconductor devices.

Accordingly, there exists a need for a new resonator element and a new electronic resonator which overcomes at least some of the shortcomings of the prior art.

SUMMARY OF THE INVENTION

This need and others are substantially met through provision of a cold cathode field emission device (FED) resonator element employed in an electronic resonator wherein the cold cathode field emission device comprises a first electron emitter element, for emitting electrons; and a first electrostatically deformable anode electrode distally disposed with respect to the first electron emitter element for collecting some emitted electrons, and further disposed such that during application of appropriate externally provided potentials the electrostatically deformable anode will be deflected in a manner which induces a change in electron emission in the FED.

In one embodiment of an electronic resonator employing an FED resonator element in accordance with the present invention a controlling electronic network is operably coupled to the various electrodes of the FED resonator and provided with a plurality of conductive paths on which control/output signals may be impressed.

In another embodiment of the electronic resonator employing an FED resonator element in accordance with the present invention an electronic controlling network is at least partially comprised of semiconductor switching devices.

In yet another embodiment of the electronic resonator employing an FED resonator element in accordance with the present invention an electronic controlling network is at least partially comprised of FED switching devices.

BRIEF DESCRIPTION OF THE DRAWINGS

FIG. 1 is a schematic depiction of a non-deformable structure under the influence of an attractive electrostatic force.

FIG. 2 is a schematic depiction of a deformable structure under the influence of an attractive electrostatic force.

FIG. 3 is a schematic representation of a first embodiment of a cold cathode field emission device.

FIG. 4A is a schematic representation of a first embodiment of a field emission device resonator element in accordance with the present invention.

FIG. 4B is a view similar to FIG. 4A of the resonator / element under the influence of an attractive electrostatic force.

FIG. 6 is a schematic representation of a second embodiment of a cold cathode field emission device.

FIG. 7A is a schematic representation of a second embodiment of a field emission device resonator element in accordance with the present invention.

FIG. 7B is a view similar to FIG. 7A illustrating the resonator element under the influence of an attractive electrostatic force.

DESCRIPTION OF THE PREFERRED EMBODIMENTS

Figure 5A:
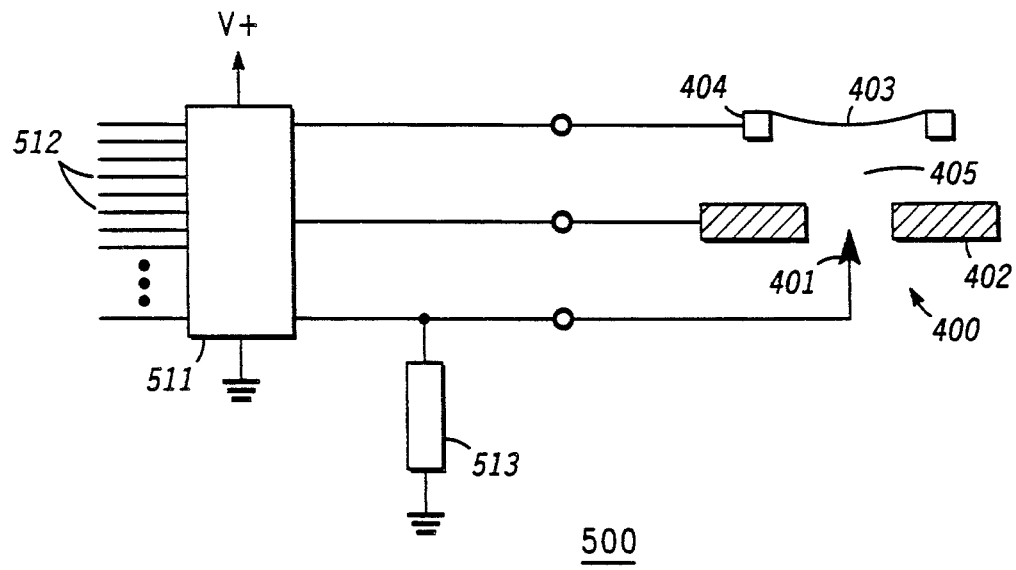
FIG. 5A is a schematic representation of a first embodiment of an electronic resonator in accordance with the present invention.

Referring now to FIG. 1 there is depicted an electronic structure 100 comprising first and second conductive elements 101, 102. For the purposes of FIG. 1 first and second conductive elements 101, 102 are disposed at a fixed distance with respect to each other. Application of an appropriate externally provided potential(voltage), V, between first and second conductive elements 101, 102 establishes an electric field, E which may be determined accordingly as $E = V/d$ where d is the separation distance between first and second conductive elements 101, 102. In the presence of the induced electric field, an electrostatic force exists which may be approximately described according to the relation $$F = \int_{x1} \int_{x2} \rho_1 \rho_2 / (4\pi e r^2) dx1 dx2$$

where $\rho$ is the charge density which resides on each of first and second conductive elements 101, 102 respectively. The form selected for structure 100 is of no consequence to the following discussion and serves only to provide an understanding of the nature and origin of an electrostatically induced force which will be utilized in the various embodiments to be described.

Referring now to FIG. 2, there is depicted schematically a structure 200 comprised of a first conductive element 201, a deformable conductive element 203 and a plurality of supporting elements 204. Deformable conductive element 203 is disposed distally with respect to first conductive element 201 and further disposed on and fixed at each end to supporting elements 204. Application of an appropriate externally provided potential induces an electrostatic force as described previously with reference to FIG. 1. In the instance of structure 200 the presence of the induced electrostatic force will result in a deformation of deformable conductive element 203, as illustrated in FIG. 2. Removal of the externally provided potential results in the removal of the induced electrostatic force and subsequently deformable conductive element 203 will relax to an unstressed (quiescent) position.

FIG. 3 is schematic representation of an embodiment of an FED 300 comprised of an electron emitter electrode 301, for emitting electrons, a gate extraction electrode 302, and an anode electrode 303 disposed distally with reference to electron emitter electrode 301, for collecting at least some of any emitted electrons. The single representation of FIG. 3 serves as both a simplified side-elevational depiction and a schematic depiction since side-elevational cross-sectional views of physical embodiments of FEDs appear generally as shown in FIG. 3 and are commonly represented schematically in the same manner. Further illustrated in FIG. 3 is an intervening region 305 between electron emitter electrode 301 and anode electrode 303. The intervening region 305 in FED 300 is fixed because anode electrode 303 and electron emitter electrode 301 are fixedly positioned relative to each other. Application of suitable externally provided potentials to at least some of the electrodes of FED 300 will induce electron emission from electron emitter electrode 301.

Referring now to FIG. 4A there is depicted a schematic representation of an FED resonator element 400 constructed in accordance with the present invention. FED resonator element 400 includes, in addition to an emitter electrode 401 and a gate extraction electrode 402, a deformable anode electrode 403 mounted by a plurality of support elements 404, and an intervening region 405. FIG. 4A illustrates deformable anode electrode 403 in a quiescent posture, characteristic of an absence of induced electrostatic force, which results from the absence of at least some externally provided potentials.

FIG. 4B is a view similar to FIG. 4A, illustrating deformable anode electrode 403 of FED resonator element 400 in a deformed posture. The deformation of anode electrode 403 occurs in the presence of an induced electrostatic force such as will exist with the application of suitable externally provided potentials between emitter electrode 401 or gate extraction electrode 402 and anode electrode 403 of FED resonator element 400.

FIG. 5A illustrates a schematic representation of an electronic resonator, designated 500, employing FED resonator element 400 in accordance with the present invention. Resonator 500 includes, in addition to resonator element 400, an electronic controlling network 511 having a plurality of conductors 512 connected thereto, and a first impedance network 513. At least some of the plurality of conductors 512 are operably coupled to at least some of the electrodes of FED resonator element 400 in a manner which provides for electronic control of FED resonator element 400 by electronic controlling network 511. Some other conductors of plurality of conductors 512 provide a means for coupling externally provided signals and potentials to electronic controlling network 511 and to make output signals available to associated circuitry (not shown) external to electronic resonator 500.

During an ON mode of operation, in which FED resonator element 400 is in a conducting state, appropriate externally provided potentials are applied to the electrodes of FED resonator element 400 which induces an initial deformation of deformable anode electrode 403 and initiates an electron current passing through impedance network 513. Impedance network 513 typically includes passive circuit elements such as, for example, resistors, capacitors, and/or inductors. During the ON mode of FED resonator element 400, at least some of the electrons emitted from electron emitter electrode 401 are collected at deformable anode electrode 403. The portion of emitted electrons collected by deformable anode electrode 403 pass through circuit elements in electronic controlling network 511, resulting in a reduction in the magnitude of the potential at deformable anode electrode 403. The reduction in potential at deformable anode electrode 403 changes the amount of deformation thereof as a result of the change in induced electrostatic force, which corresponds to the change in potential at deformable anode electrode 403.

By selectively distally disposing deformable anode electrode 403 such that small variations in the position of anode electrode 403 influence the rate of electron emission at electron emitter electrode 401, the electron current which passes through impedance network 513 is modified in accordance with the position changes. Emitted electron current is directly related to the potentials applied to the various electrodes and to the intervening distances between electron emitter electrode 401 and other electrodes of FED resonator element 400, such as the deformable anode electrode 403. A first conductor of plurality of conductors 512 operably couples impedance network 513 to electronic controlling network 511. The electron current passing through impedance network 513 is sensed by electronic controlling network 511 and provides a signal which indicates the level of electron current passing through FED resonator element 400. Circuit elements within electronic controlling network 511 interpret the signal and initiate control to turn off FED resonator element 400 when the electron current reaches a selected value.

The OFF mode may be realized by selectively decoupling some of the externally provided potentials from FED resonator element 400 by any of the known techniques such as, for example, active switching devices. In the OFF mode, deformable anode electrode 403 returns to a quiescent posture. The internal circuit elements within electronic controlling network 511 will determine the OFF mode duration as well as the signal level, originating from electron current through impedance network 513, which initiates the switch to the OFF mode. At the end of an OFF mode period, externally provided potentials are re-coupled to the various electrodes of FED resonator element 400 to re-initiate the ON mode.

Figure 5B:
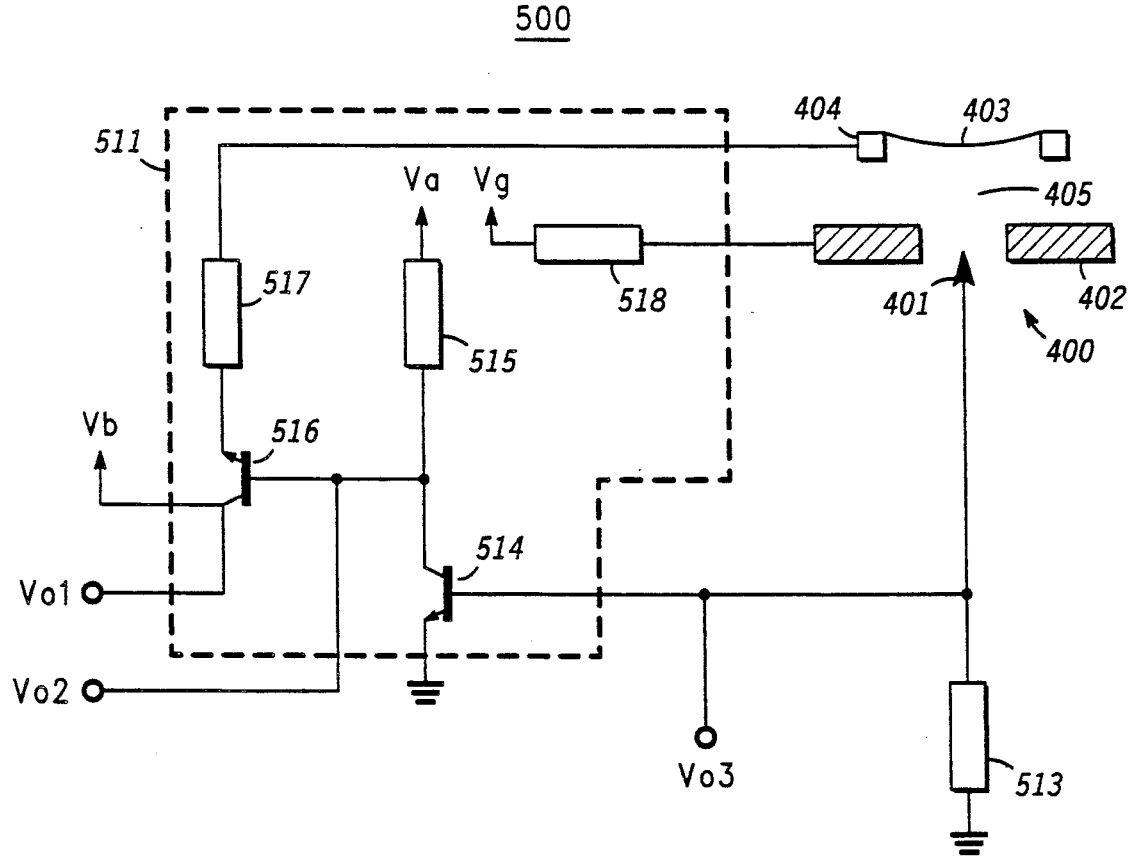
FIG. 5B is a schematic representation of a second embodiment of an electronic resonator in accordance with the present invention.

FIG. 5B is a view similar to FIG. 5A, illustrating in more detail electronic controlling network 511. As previously described, the ON mode of FED resonator element 400 causes an electron current to flow through impedance network 513. An electron current level corresponding to a voltage rise of approximately the voltage required to forward bias the emitter/base junction of a first switching transistor 514 initiates a turn-off sequence. As first switching transistor 514 turns on, a current flows through a first controlling impedance network 515 which results in a corresponding reduction of the potential presented to the base of a second transistor 516. When first switching transistor 514 is fully on (saturated), the resultant potential at the base of second transistor 516 is the collector saturation voltage of first switching transistor 514, which effectively causes second transistor 516 to be turned off. A second controlling impedance network 517 is employed in a manner typical of series pass transistor circuits to provide the requisite voltage drop necessary to maintain second transistor 516 in the desired state.

When second transistor 516 is turned off, emitted electrons are no longer collected at deformable anode electrode 403 and instead are collected at gate extraction electrode 402. The resultant electron current flows through a third controlling impedance network 518 and a corresponding reduction in potential applied at gate extraction electrode 402 follows. The reduced potential at gate extraction electrode 402 causes a reduction in the induced electrostatic force at deformable anode electrode 403 and a reduction in the electron current through FED resonator element 400. As previously described, the amount of deformation of deformable anode electrode 403 depends upon the induced electrostatic force at deformable anode electrode 403. Thus, when the induced electrostatic force reaches a predetermined amount, deformable anode electrode 403 returns to approximately the quiescent state. With FED resonator element 400 in the OFF mode, it is switched into the ON mode when the voltage levels in frequency determining networks 515, 517 and 518 reach magnitudes that permit first switching transistor 514 to be turned off and second transistor 516 to be turned on. By appropriately selecting the components of first, second, and third controlling impedance networks 515, 517, 518 the repetition rate/frequency of electronic resonator 500 is prescribed. Selectively employing RC and RLC circuits in addition to only resistive circuits as embodiments of impedance networks 515, 517 and 518 provides for frequency determination of electronic resonator 500.

In the depiction of FIG. 5B a plurality of output signal points, designated as Vo1, Vo2, and Vo3 are shown as examples of only some of the possible points at which it may be desirable to extract usable signal information from the electronic resonator.

Referring now to FIG. 6 there is shown a schematic representation of a second embodiment of an FED, designated 600, comprising an electron emitter electrode 601, an anode electrode 603, and an intervening region 605, all described previously with reference to FIG. 3.

FIGS. 7A & 7B are schematic representations of a second embodiment of an FED resonator element, designated 700, constructed in accordance with the present invention. FED resonator element 700 includes an electron emitter electrode 701, a deformable anode electrode 703 mounted on a plurality of support elements 704, and an intervening region 705. FED resonator element 700 functions as an FED diode wherein appropriate externally provided potentials applied to deformable anode electrode 703 and electron emitter electrode 701 induce an electrostatic force which deforms deformable anode electrode 703. FIG. 7A depicts FED resonator element 700 in a quiescent posture characteristic of an absence of induced electrostatic force. FIG. 7B illustrates FED resonator element 700 in a deformed state as a result of an attendant electrostatic force.

Figure 8:
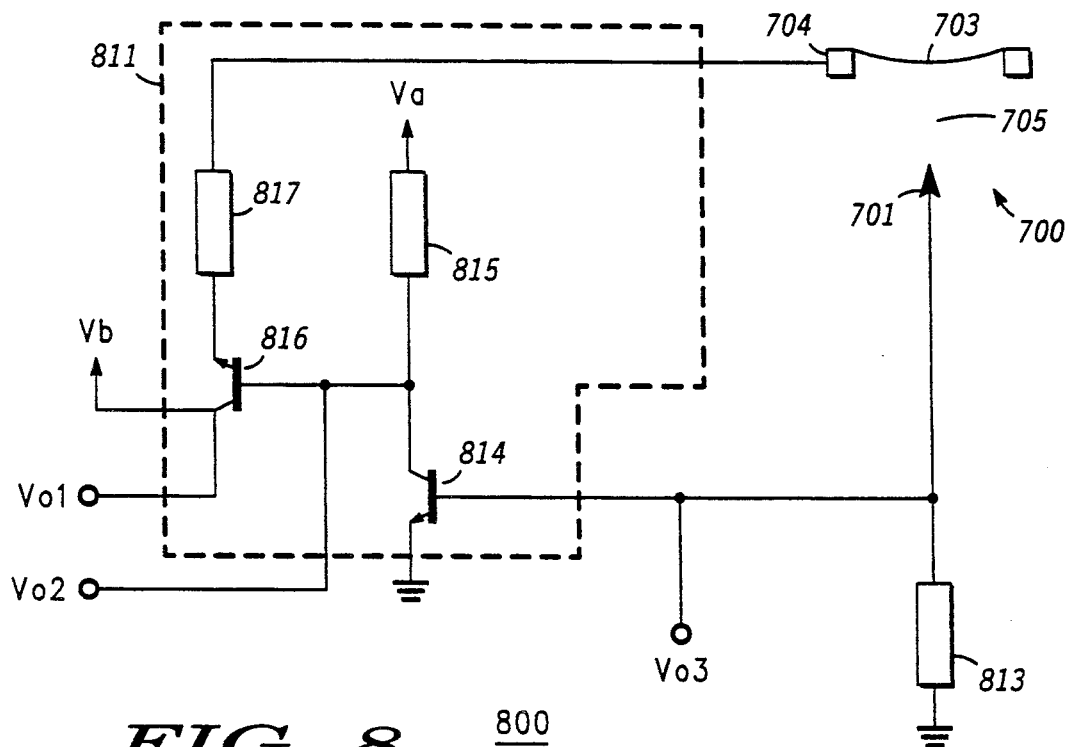
FIG. 8 is a schematic representation of a third embodiment of an electronic resonator in accordance with the present invention.

FIG. 8 is a schematic representation of a third embodiment of an electronic resonator, designated 800, constructed in accordance with the present invention. Electronic resonator 800 utilizes FED resonator element 700, described previously with reference to FIGS. 7A and 7B. The various components of resonator 800 which are similar to resonator 500 are designated with similar numbers having an "8" prefix to indicate the different embodiment. Electronic resonator 800 operates similar to the operation of electronic resonator 500, described previously with reference to FIG. 5B, with respect to turn on/turn off repetition rates and frequency determination by the various impedance networks. A difference in operation occurs because electronic resonator 800 does not utilize a controlling impedance network similar to third controlling impedance network 518 of FIG. 5B. Electronic resonator 800 relies on the induced electrostatic force developed between electron emitter electrode 701 and deformable anode electrode 703, rather than the induced electrostatic force developed between gate extraction electrode 402 and deformable anode electrode 403 in FED resonator element 400 (FIGS. 4A and 4B).

Figure 9:
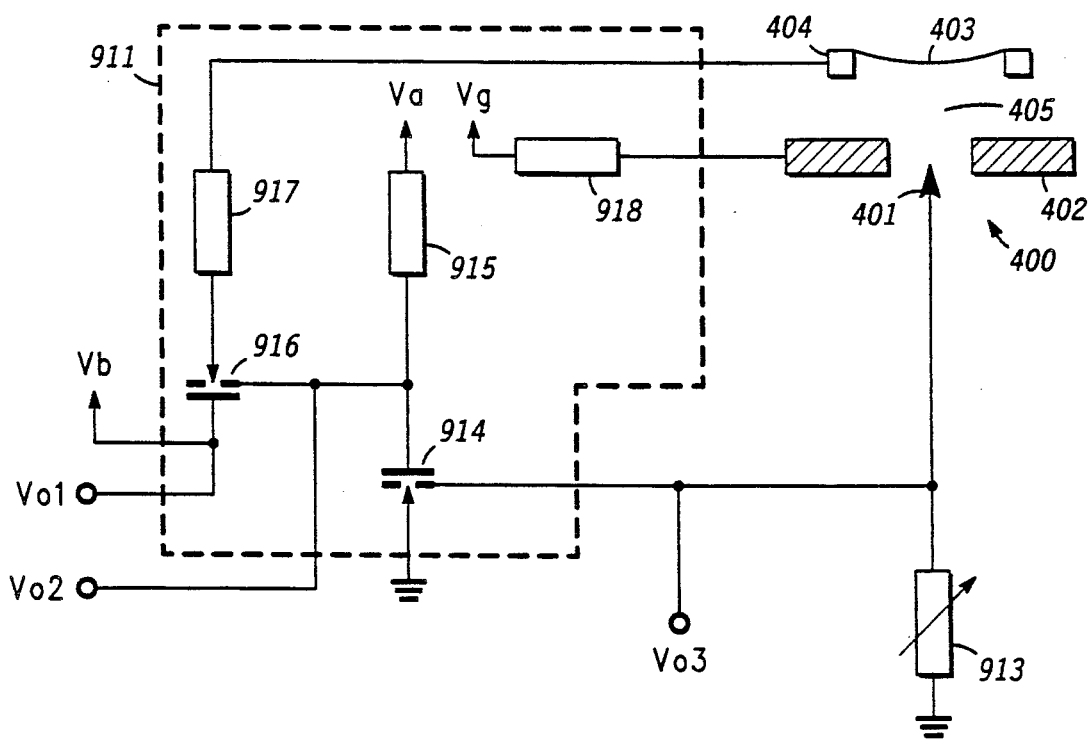
FIG. 9 is a schematic representation of a fourth embodiment of an electronic resonator in accordance with the present invention.

FIG. 9 illustrates a fourth embodiment of an electronic resonator, designated 900, employing FED resonator element 400. Electronic resonator 900 is similar to electronic resonator 500 illustrated in FIG. 5B and similar components are numbered similarly, with a "9" prefix to indicate the different embodiment. The major difference between electronic resonator 500 and electronic resonator 900 is the fact that a first switching transistor 914 and a second transistor 916 are FEDs.

Electronic resonator 900 in FIG. 9 is further illustrated as a variable frequency resonator. In this specific embodiment, impedance network 913 is a variable impedance which, when varied, alters the predetermined potentials in resonator 900. These predetermined potentials, which are effective in the operation of electron emitter 401 and deformable anode 403, produce deflection in deformable anode 403 in a manner which induces increased electron emission in the field emission device, as previously explained. Variations in impedance network 913, which can be accomplished either manually/mechanically or electronically, alter the resonant frequency of electronic resonator 900 by changing the potential at which the FED turns on and off.

Thus, new electronic resonator elements and circuits are disclosed which greatly increase the upper limits on the operating frequency. Because the required change in characteristics to provide resonance occurs in an FED and because FEDs are extremely small, the changes in characteristics occur very rapidly and, therefore, greatly extend the upper limit of the resonator. Further, most, if not all, of the components of the new electronic resonators can be integrated onto a single semiconductor chip for substantial improvements in cost and power consumption.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What we claim is:

1. A cold cathode field emission device comprising:
   an emitter for emitting electrons;
   an electrostatically deformable anode distally disposed with respect to said emitter for collecting at least some emitted electrons from said emitter; and said emitter and said electrostatically deformable anode being further disposed such that the application of appropriate potentials thereto causes said electrostatically deformable anode to be deflected in a manner which induces a change in electron emission in the field emission device.

2. The cold cathode field emission device of claim 1 further comprising a gate extraction electrode proximally disposed with respect to the emitter.

3. An electronic resonator comprising:
a resonator element including a cold cathode field emission device having an electron emitter, a deformable anode distally disposed with respect to said electron emitter and further disposed such that application of predetermined potentials to said electron emitter and said deformable anode produces deflection in said deformable anode in a manner which induces a change in electron emission in the field emission device;
an impedance network operably coupled to said electron emitter; and
a control network including an element for controlling the application of the predetermined potentials in said cold cathode field emission device.

4. The electronic resonator of claim 3 wherein the cold cathode field emission device further includes a plurality of conductors operably coupled to said electron emitter and said deformable anode and a gate extraction electrode proximally disposed with respect to the electron emitter and operably coupled to at least one of the plurality of conductors.

5. An electronic resonator comprising:
a resonator element including a cold cathode field emission device having an electron emitter and a deformable anode distally disposed with respect to said electron emitter, said deformable anode being further disposed with respect to said electron emitter such that application of predetermined potentials to said electron emitter and said deformable anode causes the deformable anode to be deflected in a manner which induces a change in electron emission in the field emission device;
an impedance network operably coupled to said electron emitter; and
an electronic control network including an electronic circuit element coupled to said electron emitter and deformable anode for controlling deflection of said deformable anode in the cold cathode field emission device and a frequency determining network connected to said electronic circuit element.

6. The electronic resonator of claim 5 wherein the cold cathode field emission device further includes a plurality of conductors coupled to said electron emitter and deformable anode and a gate extraction electrode proximally disposed with respect to the electron emitter and operably coupled to at least one of the plurality of conductors.

7. The electronic resonator of claim 5 wherein the frequency determining network includes passive network elements.

8. The electronic resonator of claim 5 wherein the frequency determining network includes an active device.

9. The electronic resonator of claim 8 wherein the active device is a field emission device.

10. A variable frequency electronic resonator comprising:
a resonator element including a cold cathode field emission device having an electron emitter and an electrostatically deformable anode distally disposed with respect to said electron emitter and further disposed such that the application of predetermined potentials to said electron emitter and said electrostatically deformable anode causes said electrostatically deformable anode to be deflected in a manner which induces increased electron emission in the field emission device;
an impedance network operably coupled to said electron emitter; and
an electronic control network including an electronic circuit element coupled to one of said electron emitter and said electrostatically deformable anode for controlling electron emission in the cold cathode field emission device and a variable frequency determining network coupled to said electronic circuit element for selectively determining the operating frequency of the electronic resonator.

11. The variable frequency electronic resonator of claim 10 wherein the cold cathode field emission device further includes a gate extraction electrode proximally disposed with respect to the electron emitter.

12. The variable frequency electronic resonator of claim 10 wherein the frequency determining network includes passive network elements.

13. The variable frequency electronic resonator of claim 10 wherein the frequency determining network includes an active device.

14. The variable frequency electronic resonator of claim 13 wherein the first active device is a field emission device.

15. The variable frequency electronic resonator of claim 10 including in addition electronic circuitry for electronically selecting the operating frequency.

16. The variable frequency electronic resonator of claim 10 including in addition manual/mechanical apparatus for selecting the operating frequency.

* * * * *